(12) United States Patent
Marr et al.

(10) Patent No.: US 12,354,669 B2
(45) Date of Patent: Jul. 8, 2025

(54) DISCHARGE CIRCUITS

(71) Applicant: MICRON TECHNOLOGY, INC., Boise, ID (US)

(72) Inventors: Kenneth W. Marr, Boise, ID (US); James E. Davis, Meridian, ID (US); Chiara Cerafogli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 317 days.

(21) Appl. No.: 17/897,448

(22) Filed: Aug. 29, 2022

(65) Prior Publication Data

US 2024/0071516 A1    Feb. 29, 2024

(51) Int. Cl.
*G11C 7/22* (2006.01)
*G11C 16/04* (2006.01)
*G11C 16/16* (2006.01)
*G11C 16/22* (2006.01)

(52) U.S. Cl.
CPC .......... *G11C 16/22* (2013.01); *G11C 16/0483* (2013.01); *G11C 16/16* (2013.01)

(58) Field of Classification Search
CPC ....... G11C 7/24; G11C 16/22; G11C 16/0483; G11C 16/30; G11C 16/16
See application file for complete search history.

(56) References Cited

U.S. PATENT DOCUMENTS

2017/0110170 A1*  4/2017  Kong ................... H10D 89/611

* cited by examiner

*Primary Examiner* — Jason Lappas
(74) *Attorney, Agent, or Firm* — Dicke, Billig & Czaja, PLLC (57) ABSTRACT

A discharge circuit includes a transistor and a metal resistor connected to the transistor. The transistor includes a plurality of unit cells. The metal resistor includes a plurality of resistor portions corresponding to the plurality of unit cells. Each unit cell of the plurality of unit cells has a footprint and a corresponding resistor portion of the plurality of resistor portions is arranged within the footprint.

23 Claims, 8 Drawing Sheets

DISCHARGE CIRCUITS

TECHNICAL FIELD

The present disclosure relates generally to discharge circuits and, in particular, in one or more embodiments, the present disclosure relates to discharge circuits for high-voltage, high-capacitance nets.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

A source in a NAND flash memory might be both high-voltage (e.g., greater than 15V) and high-capacitance (e.g., greater than 1 nF). During operation of the NAND flash memory, a source might need to be charged and discharged. During discharging of the source, the flash memory should remain in a safe operating area (SOA) and snapback should be avoided to prevent damage to the flash memory.

DETAILED DESCRIPTION

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

A discharge circuit for discharging a high-voltage (e.g., greater than 15V), high-capacitance (e.g., greater than 1 nF) net (e.g., node) in an integrated circuit might include a plurality of high-voltage transistors (e.g., 3 to 6 transistors) connected in a voltage stepdown configuration (e.g., in series). To improve performance and reduce area compared to a discharge circuit connected in a voltage stepdown configuration, the discharge circuits disclosed herein include a single high-voltage transistor with an embedded area-neutral metal resistor while addressing safe operating area (SOA) and snapback concerns. The disclosed discharge circuits might have improved performance compared to discharge circuits connected in a voltage stepdown configuration since the removal of the series devices increases conductance. The disclosed discharge circuits might also occupy a reduced area since removal of the series devices decreases area consumption. Snapback/aging might be mitigated within the disclosed discharge circuits via an adjustable negative-feedback source resistance and/or an adjustable drain resistance. Snapback might also be mitigated within the disclosed discharge circuits by applying a stepped control signal to the discharge circuits so that the discharge circuits remain in a safe operating area. The resistance of each unit cell of the high-voltage transistor of the discharge circuits might be individually tuned for each unit cell. The transistor width of each unit cell might be aligned with an area-neutral embedded resistor portion of the metal resistor. Thus, the discharge circuits disclosed herein might enable a smaller discharge circuit compared to discharge circuits connected in a voltage stepdown configuration, thereby enabling a die-size reduction and/or a faster discharge circuit for improved performance.

Figure 1A:
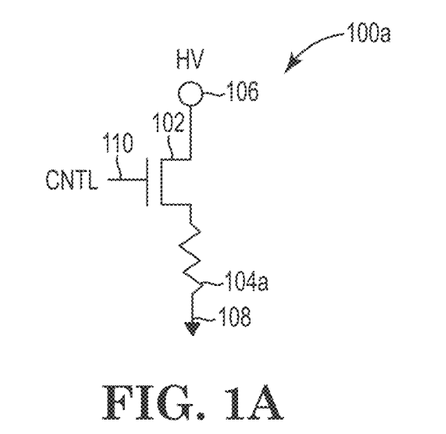
FIGS. 1A-1C are simplified schematic diagrams of discharge circuits according to various embodiments.

FIG. 1A is a simplified schematic diagram of a discharge circuit 100a according to an embodiment. Discharge circuit 100a includes a high-voltage transistor 102 and a metal resistor 104a connected to the transistor 102. The transistor 102 might be an N-channel high-voltage metal-oxide-semiconductor field-effect transistor (MOSFET) (e.g., a NMOS transistor or a triple well NMOS transistor) including a plurality of unit cells. One side of the source-drain path (e.g., drain) of the transistor 102 might be connected to a high-voltage (HV) node 106. The other side of the source-drain path (e.g., source) of the transistor 102 might be connected to one side of the metal resistor 104a. The other side of the metal resistor 104a might be connected to a reference voltage node 108 (e.g., a common or ground node). The gate of the transistor 102 might be connected to a control (CNTL) signal node 110. As described below with reference to FIGS. 2A-2C, the metal resistor 104a might include a plurality of resistor portions corresponding to the plurality of unit cells of the transistor 102. Each unit cell of the plurality of unit cells has a footprint and a corresponding resistor portion of the plurality of resistor portions might be arranged within the footprint.

Discharge circuit 100a might discharge the voltage on the high-voltage node 106 in response to a control signal on the control signal node 110. In response to a sufficient control signal (e.g., voltage level) on the control signal node 110, the discharge circuit 100a is enabled, transistor 102 is turned on (e.g., conducting), and high-voltage node 106 is discharged through the metal resistor 104a to the reference voltage node 108. In response to no control signal (e.g., 0V) on the control signal node 110, the discharge circuit 100a is disabled, transistor 102 is turned off (e.g., not conducting), and high-voltage node 106 is not discharged through the metal resistor 104a.

Figure 1B:
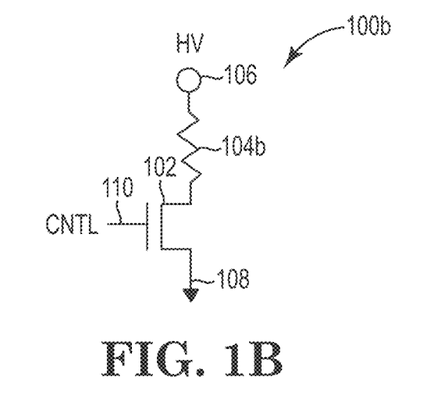

FIG. 1B is a simplified schematic diagram of a discharge circuit 100b according to another embodiment. Discharge circuit 100b includes a high-voltage transistor 102 as previously described above with reference to FIG. 1A and a metal resistor 104b connected to the transistor 102. One side of the source-drain path (e.g., drain) of the transistor 102 might be connected to one side of the metal resistor 104b. The other side of the metal resistor 104b might be connected to a high-voltage (HV) node 106. The other side of the source-drain path (e.g., source) of the transistor 102 might be connected to a reference voltage node 108. The gate of the transistor 102 might be connected to a control (CNTL) signal node 110. As described below with reference to FIGS. 2A-2C, the metal resistor 104b might include a plurality of resistor portions corresponding to the plurality of unit cells of the transistor 102. Each unit cell of the plurality of unit cells has a footprint and a corresponding resistor portion of the plurality of resistor portions might be arranged within the footprint.

Discharge circuit 100b might discharge the voltage on the high-voltage node 106 in response to a control signal on the control signal node 110. In response to a sufficient control signal (e.g., voltage level) on the control signal node 110, the discharge circuit 100b is enabled, transistor 102 is turned on (e.g., conducting), and high-voltage node 106 is discharged through the metal resistor 104b to the reference voltage node 108. In response to no control signal (e.g., 0V) on the control signal node 110, the discharge circuit 100b is disabled, transistor 102 is turned off (e.g., not conducting), and high-voltage node 106 is not discharged through the metal resistor 104b.

Figure 1C:
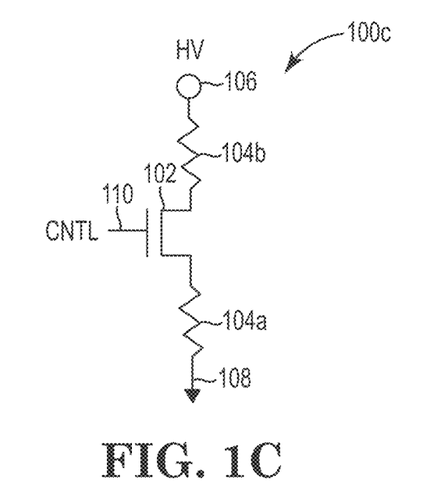

FIG. 1C is a simplified schematic diagram of a discharge circuit 100c according to another embodiment. Discharge circuit 100c includes a high-voltage transistor 102 as previously described above with reference to FIG. 1A and a metal resistor 104a/104b connected to the transistor 102. In this embodiment, the metal resistor includes a first segment 104a and a second segment 104b. One side of the source-drain path (e.g., source) of the transistor 102 might be connected to one side of the first segment 104a of the metal resistor. The other side of the first segment 104a of the metal resistor might be connected to a reference voltage node 108. The other side of the source-drain path (e.g., drain) of the transistor 102 might be connected to one side of the second segment 104b of the metal resistor. The other side of the second segment 104b of the metal resistor might be connected to a high-voltage (HV) node 106. The gate of transistor 102 might be connected to a control (CNTL) signal node 110. As described below with reference to FIGS. 2A-2C, the metal resistor 104a/104b might include a plurality of resistor portions corresponding to the plurality of unit cells of the transistor 102. Each unit cell of the plurality of unit cells has a footprint and a corresponding resistor portion of the plurality of resistor portions might be arranged within the footprint.

Discharge circuit 100c might discharge the voltage on high-voltage node 106 in response to a control signal on the control signal node 110. In response to a sufficient control signal (e.g., voltage level) on the control signal node 110, the discharge circuit 100c is enabled, transistor 102 is turned on (e.g., conducting), and high-voltage node 106 is discharged through the second segment 104b and the first segment 104a of the metal resistor to the reference voltage node 108. In response to no control signal (e.g., 0V) on the control signal node 110, the discharge circuit 100c is disabled, transistor 102 is turned off (e.g., not conducting), and high-voltage node 106 is not discharged through the second segment 104b and the first segment 104a of the metal resistor.

Figure 2A:
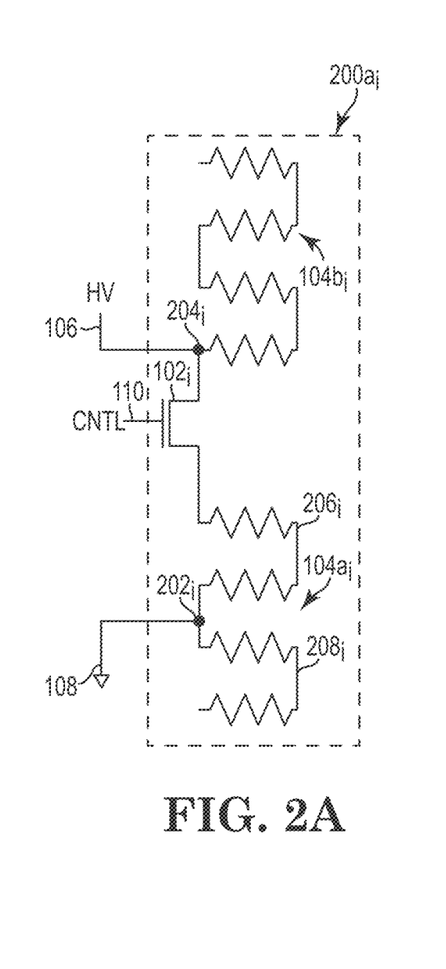
FIGS. 2A-2C are schematic diagrams of unit cells of a transistor of the discharge circuits of FIGS. 1A-1C, respectively, according to various embodiments.

FIG. 2A is a schematic diagram of one unit cell $200a_i$ of a transistor 102 according to an embodiment. A plurality of unit cells $200a_0$ to $200a_i$ of transistor 102 may be connected in parallel (as described below with reference to FIG. 4) to provide discharge circuit 100a previously described and illustrated with reference to FIG. 1A, where "i" is any suitable number (e.g., 2 to 15). Each unit cell $200a_i$ includes a transistor finger $102_i$ and a metal resistor portion $104a_i$/

$104b_i$. The metal resistor portion includes a first segment $104a_i$ and a second segment $104b_i$. The first segment $104a_i$ might be directly connected to one side of the source-drain path (e.g., source) of the transistor finger $102_i$, and the second segment $104b_i$ might be directly connected to the other side of the source-drain path (e.g., drain) of the transistor finger $102_i$. The gate of the transistor finger $102_i$ might be connected to a control signal node 110.

Unit cell $200a_i$ also includes a first contact $202_i$ and a second contact $204_i$. The first contact $202_i$ might be connected to the first segment $104a_i$ to connect one side of the source-drain path (e.g., source) of the transistor finger $102_i$ to a reference voltage node 108. In this embodiment, the first contact $202_i$ might be connected to the first segment $104a_i$ such that a first part of the first segment $104a_i$ as indicated at $206_i$ might be connected between the first contact $202_i$ and one side of the source-drain path (e.g., source) of the transistor finger $102_i$ and a second part of the first segment $104a_i$ as indicated at $208_i$ might be floating. The point along the first segment $104a_i$ where the first contact $202_i$ is connected may be adjusted to adjust the resistance connected between the first contact $202_i$ and one side of the source-drain path (e.g., source) of the transistor finger $102_i$. In other embodiments, the first contact $202_i$ might be connected to the end of the first segment $104a_i$ such that the entire first segment $104a_i$ is connected between the first contact $202_i$ and one side of the source-drain path (e.g., source) of the transistor finger $102_i$ and none of the first segment $104a_i$ is floating.

The second contact $204_i$ might be connected to the second segment $104b_i$ to connect the other side of the source-drain path (e.g., drain) of the transistor finger $102_i$ to a high-voltage node 106 connected to a circuit to be discharged. In this embodiment, the second contact $204_i$ might be connected to the second segment $104b_i$ such that the second segment $104b_i$ is floating. That is, the second contact $204_i$ might be directly connected to one side of the source-drain path (e.g., drain) of the transistor finger $102_i$ such that the entire second segment $104b_i$ is floating.

Figure 2B:
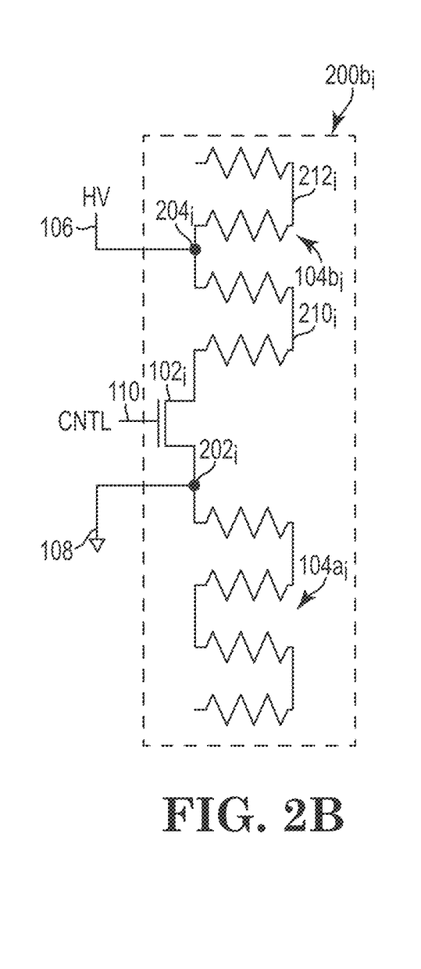

FIG. 2B is a schematic diagram of one unit cell $200b_i$ of a transistor 102 according to another embodiment. A plurality of unit cells $200b_0$ to $200b_i$ of transistor 102 may be connected in parallel (as described below with reference to FIG. 4) to provide discharge circuit $100b$ previously described and illustrated with reference to FIG. 1B. Each unit cell $200b_i$ includes a transistor finger $102_i$ and a metal resistor portion $104a_i/104b_i$. The metal resistor portion includes a first segment $104a_i$ and a second segment $104b_i$. The first segment $104a_i$ might be directly connected to one side of the source-drain path (e.g., source) of the transistor finger $102_i$, and the second segment $104b_i$ might be directly connected to the other side of the source-drain path (e.g., drain) of the transistor finger $102_i$. The gate of the transistor finger $102_i$ might be connected to a control signal node 110.

Unit cell $200b_i$ also includes a first contact $202_i$ and a second contact $204_i$. The first contact $202_i$ might be connected to the first segment $104a_i$ to connect one side of the source-drain path (e.g., source) of the transistor finger $102_i$ to a reference voltage node 108. In this embodiment, the first contact $202_i$ might be connected to the first segment $104a_i$ such that first segment $104a_i$ is floating. That is, the first contact $202_i$ might be directly connected to one side of the source-drain path (e.g., source) of the transistor finger $102_i$ such that the entire first segment $104a_i$ is floating.

The second contact $204_i$ might be connected to the second segment $104b_i$ to connect the other side of the source-drain path (e.g., drain) of the transistor finger $102_i$ to a high-voltage node 106 connected to a circuit to be discharged. In this embodiment, the second contact $204_i$ might be connected to the second segment $104b_i$ such that a first part of the second segment $104b_i$ as indicated at $210_i$ might be connected between the second contact $204_i$ and one side of the source-drain path (e.g., drain) of the transistor finger $102_i$ and a second part of the second segment $104b_i$ as indicated at $212_i$ might be floating. The point along second segment $104b_i$ where the second contact $204_i$ is connected may be adjusted to adjust the resistance connected between the second contact $204_i$ and one side of the source-drain path (e.g., drain) of the transistor finger $102_i$. In other embodiments, the second contact $204_i$ might be connected to the end of the second segment $104b_i$ such that the entire second segment $104b_i$ is connected between the second contact $204_i$ and one side of the source-drain path (e.g., drain) of the transistor finger $102_i$ and none of the second segment $104b_i$ is floating.

Figure 2C:
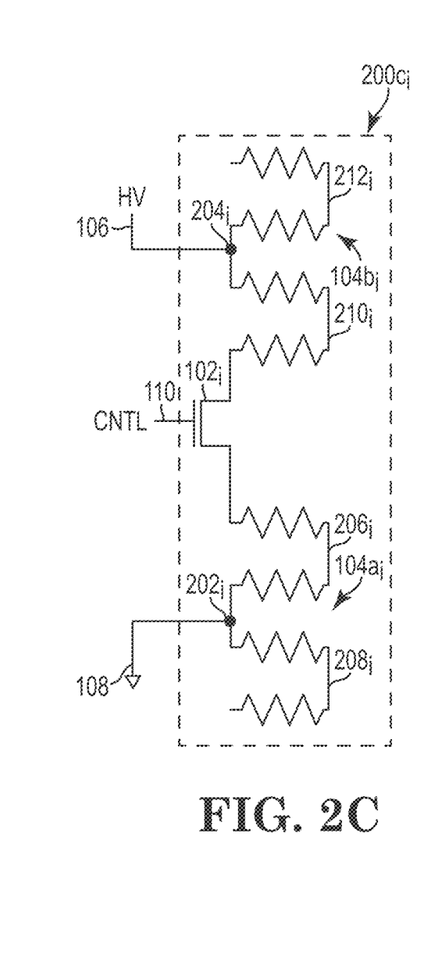

FIG. 2C is a schematic diagram of one unit cell $200c_i$ of a transistor 102 according to another embodiment. A plurality of unit cells $200c_0$ to $200c_i$ of transistor 102 may be connected in parallel (as described below with reference to FIG. 4) to provide discharge circuit $100c$ previously described and illustrated with reference to FIG. 1C. Each unit cell $200c_i$ includes a transistor finger $102_i$ and a metal resistor portion $104a_i/104b_i$. The metal resistor portion includes a first segment $104a_i$ and a second segment $104b_i$. The first segment $104a_i$ might be directly connected to one side of the source-drain path (e.g., source) of the transistor finger $102_i$, and the second segment $104b_i$ might be directly connected to the other side of the source-drain path (e.g., drain) of the transistor finger $102_i$. The gate of the transistor finger $102_i$ might be connected to a control signal node 110.

Unit cell $200c_i$ also includes a first contact $202_i$ and a second contact $204_i$. The first contact $202_i$ might be connected to the first segment $104a_i$ to connect one side of the source-drain path (e.g., source) of the transistor finger $102_i$ to a reference voltage node 108. In this embodiment, the first contact $202_i$ might be connected to the first segment $104a_i$ such that a first part of the first segment $104a_i$ as indicated at $206_i$ might be connected between the first contact $202_i$ and one side of the source-drain path (e.g., source) of the transistor finger $102_i$ and a second part of the first segment $104a_i$ as indicated at $208_i$ might be floating. The point along first segment $104a_i$ where the first contact $202_i$ is connected may be adjusted to adjust the resistance connected between the first contact $202_i$ and one side of the source-drain path (e.g., source) of the transistor finger $102_i$. In other embodiments, the first contact $202_i$ might be connected to the end of the first segment $104a_i$ such that the entire first segment $104a_i$ is connected between the first contact $202_i$ and one side of the source-drain path (e.g., source) of the transistor finger $102_i$ and none of the first segment $104a_i$ is floating.

The second contact $204_i$ is connected to the second segment $104b_i$ to connect the other side of the source-drain path (e.g., drain) of the transistor finger $102_i$ to a high-voltage node 106 connected to a circuit to be discharged. In this embodiment, the second contact $204_i$ might be connected to the second segment $104b_i$ such that a first part of the second segment $104b_i$ as indicated at $210_i$ might be connected between the second contact $204_i$ and one side of the source-drain path (e.g., drain) of the transistor finger $102_i$ and a second part of the second segment $104b_i$ as indicated at $212_i$ might be floating. The point along second segment $104b_i$ where the second contact $204_i$ is connected may be adjusted to adjust the resistance connected between the second contact $204_i$ and one side of the source-drain path (e.g., drain) of the transistor finger $102_i$. In other embodiments, the second contact $204_i$ might be connected to the end of the second segment $104b_i$ such that the entire second segment $104b_i$ is connected between the second contact $204_i$ and one side of the source-drain path (e.g., drain) of the transistor finger $102_i$ and none of the second segment $104b_i$ is floating.

Figure 3:
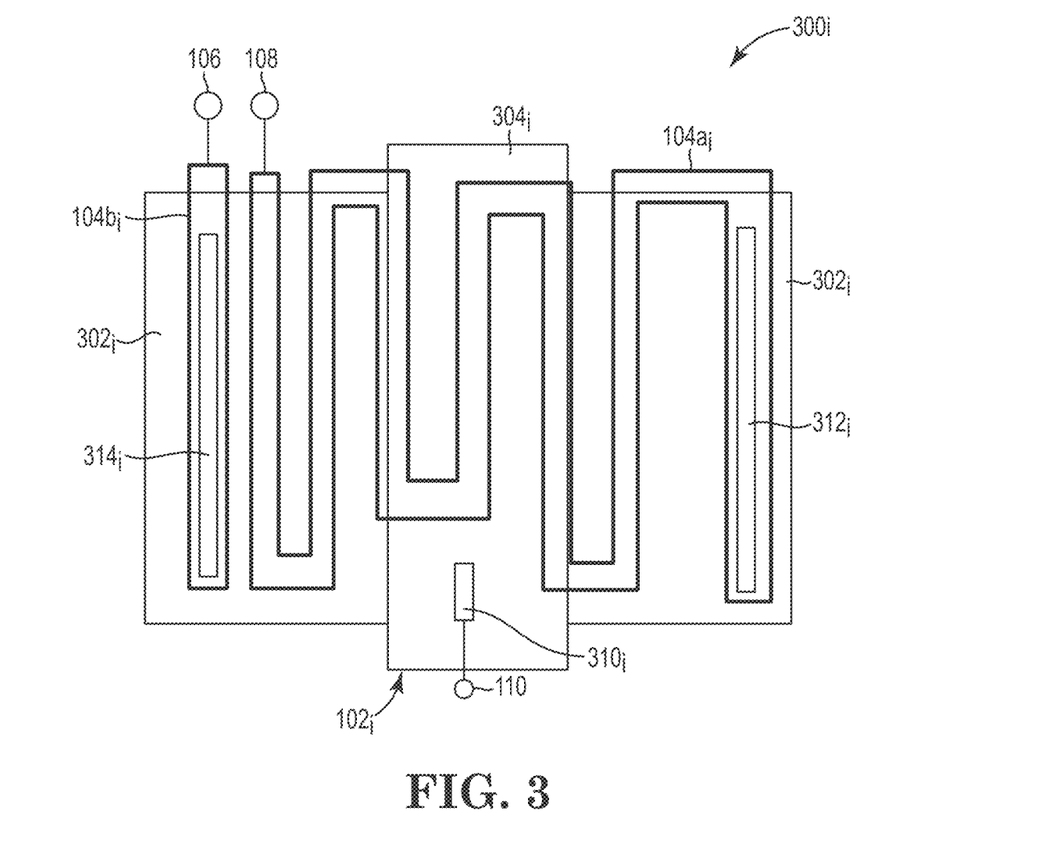
FIG. 3 is a schematic layout diagram of a unit cell of a transistor and a resistor portion of a discharge circuit according to an embodiment.

FIG. 3 is a schematic layout diagram of a unit cell $300_i$ of a transistor 102 according to an embodiment. A plurality of unit cells $300_0$ to $300_i$ of the transistor 102 may be connected in parallel to provide a discharge circuit, such as discharge circuit 100a, 100b, or 100c as previously described and illustrated with reference to FIGS. 1A-1C. Each unit cell $300_i$ might include a transistor finger $102_i$ including an active region $302_i$ and a polysilicon region $304_i$, contacts $310_i$, $312_i$, and $314_i$, and a metal resistor portion $104a_i/104b_i$. The metal resistor portion includes a first segment $104a_i$ and a second segment $104b_i$. The active region $302_i$ defines a source and a drain of the transistor finger $102_i$. The polysilicon region $304_i$ defines a gate of the transistor finger $102_i$.

Contact $310_i$ might be a gate contact to connect the gate of the transistor finger $102_i$ to a control signal node 110. Contact $310_i$ might be a vertical contact to connect the gate of the transistor finger $102_i$ in a lower layer of a semiconductor integrated circuit to the control signal node 110 in an upper layer of the semiconductor integrated circuit. Contact $312_i$ might be a source contact to connect the source of the transistor finger $102_i$ to the first segment $104a_i$ of the metal resistor portion. The first segment $104a_i$ might also be connected to a reference voltage node 108. Contact $312_i$ might be a vertical contact to connect the source of the transistor finger $102_i$ in a lower layer of the semiconductor integrated circuit to the first segment $104a_i$ in an upper layer of the semiconductor integrated circuit. Contact $314_i$ might be a drain contact to connect the drain of the transistor finger $102_i$ to the second segment $104b_i$ of the metal resistor portion. The second segment $104b_i$ might also be connected to a high-voltage node 106. Contact $314_i$ might be a vertical contact to connect the drain of the transistor finger $102_i$ in a lower layer of the semiconductor integrated circuit to the second segment $104b_i$ in an upper layer of the semiconductor integrated circuit.

As illustrated in FIG. 3, the unit cell $300_i$ has a footprint and the resistor portion $104a_i/104b_i$ is arranged within the footprint. In this example, the first segment $104a_i$ might include a relatively long metal (e.g., tungsten) trace (and corresponding relatively higher resistance) including a plurality of trace segments arranged in a zigzag or serpentine arrangement, while second segment $104b_i$ might include a relatively short metal (e.g., tungsten) trace (and corresponding relatively lower resistance) having a single trace segment arranged in a line. In other examples, first segment $104a_i$ might include a metal trace having a different length (and corresponding different resistance) and may include a different number of trace segments arranged in a zigzag or serpentine arrangement or a single trace segment arranged in a line, while second segment $104b_i$ might include a metal trace having a different length (and corresponding different resistance) and may include a plurality of trace segments arranged in a zigzag or serpentine arrangement. Accordingly, first segment $104a_i$ and second segment $104b_i$ might be arranged to set the desired resistance of first segment $104a_i$ and second segment $104b_i$, respectively.

Figure 4:
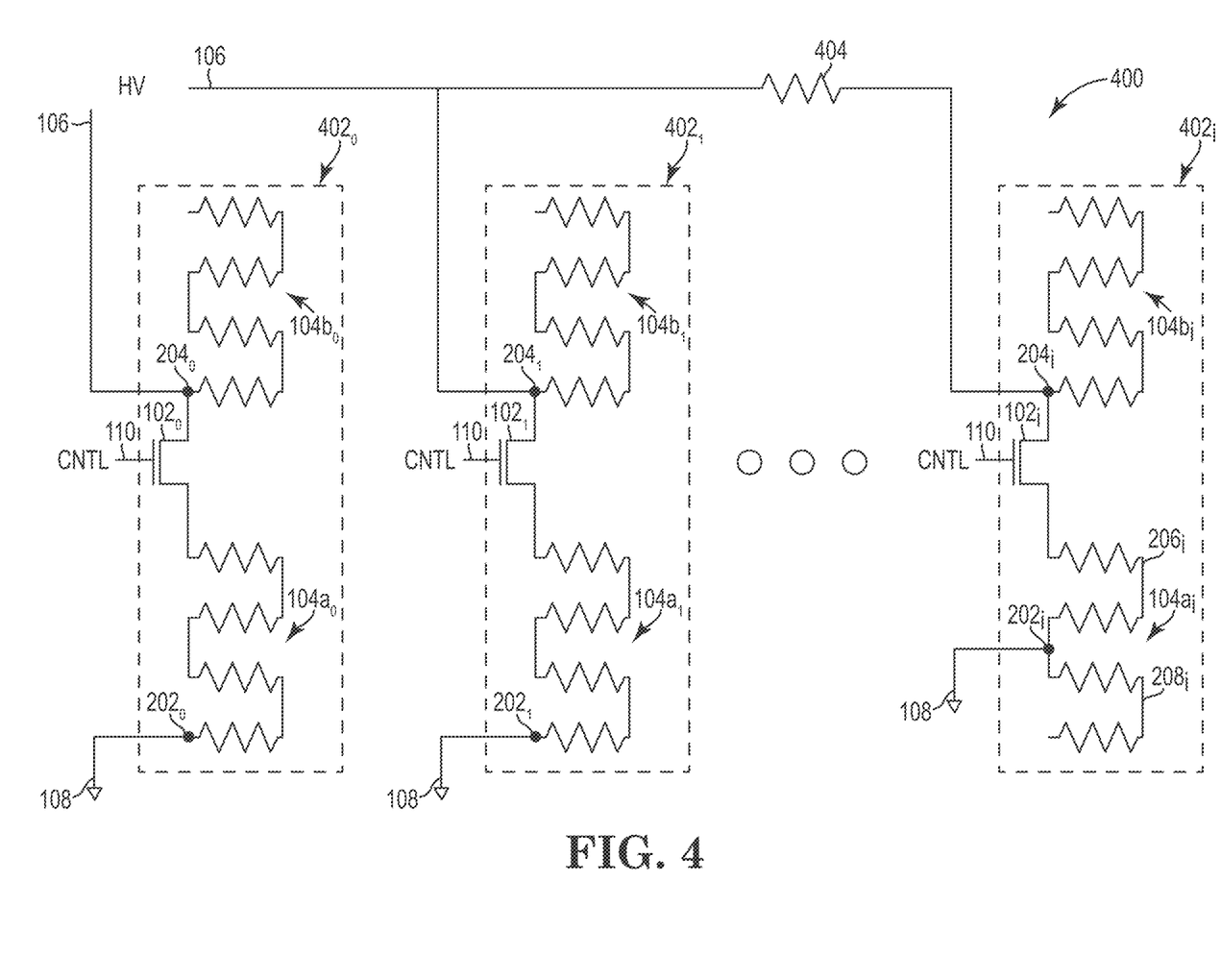
FIG. 4 is a schematic diagram of a discharge circuit according to another embodiment.

FIG. 4 is a schematic diagram of a discharge circuit 400 according to another embodiment. Discharge circuit 400 includes a transistor 102 including a plurality of unit cells $402_0$ to $402_i$. Discharge circuit 400 also includes a metal resistor 104a/104b connected to the transistor 102. The metal resistor includes a plurality of resistor portions $104a_0/104b_0$ to $104a_i/104b_i$ corresponding to the plurality of unit cells $402_0$ to $402_i$, respectively. As previously described, each unit cell $402_0$ to $402_i$ has a footprint and a corresponding resistor portion $104a_0/104b_0$ to $104a_i/104b_i$ is arranged within the footprint. The plurality of unit cells $402_0$ to $402_i$ of transistor 102 are connected in parallel.

Unit cell $402_0$ includes a transistor finger $102_0$ and a metal resistor portion $104a_0/104b_0$. The metal resistor portion includes a first segment $104a_0$ and a second segment $104b_0$. The first segment $104a_0$ might be directly connected to one side of the source-drain path (e.g., source) of the transistor finger $102_0$, and the second segment $104b_0$ might be directly connected to the other side of the source-drain path (e.g., drain) of the transistor finger $102_0$. The gate of the transistor finger $102_0$ might be connected to a control signal node 110. Unit cell $402_0$ also includes a first contact $202_0$ and a second contact $204_0$. The first contact $202_0$ might be connected to the first segment $104a_0$ to connect one side of the source-drain path (e.g., source) of the transistor finger $102_0$ to a reference voltage node 108. In this embodiment, the first contact $202_0$ might be connected to the first segment $104a_0$ such that the entire first segment $104a_0$ is connected between the first contact $202_0$ and one side of the source-drain path (e.g., source) of the transistor finger $102_0$. The second contact $204_0$ might be connected to the second segment $104b_0$ to connect the other side of the source-drain path (e.g., drain) of the transistor finger $102_0$ to a high-voltage node 106 connected to a circuit to be discharged. In this embodiment, the second contact $204_0$ might be connected to the second segment $104b_0$ such that the entire second segment $104b_0$ is floating.

Likewise, unit cell $402_1$ includes a transistor finger $102_1$ and a metal resistor portion $104a_1/104b_1$. The metal resistor portion includes a first segment $104a_1$ and a second segment $104b_1$. The first segment $104a_1$ might be directly connected to one side of the source-drain path (e.g., source) of the transistor finger $102_1$, and the second segment $104b_1$ might be directly connected to the other side of the source-drain path (e.g., drain) of the transistor finger $102_1$. The gate of the transistor finger $102_1$ might be connected to the control signal node 110. Unit cell $402_1$ also includes a first contact $202_1$ and a second contact $204_1$. The first contact $202_1$ might be connected to the first segment $104a_1$ to connect one side of the source-drain path (e.g., source) of the transistor finger $102_1$ to the reference voltage node 108. In this embodiment, the first contact $202_1$ might be connected to the first segment $104a_1$ such that the entire first segment $104a_1$ is connected between the first contact $202_1$ and one side of the source-drain path (e.g., source) of the transistor finger $102_1$. The second contact $204_1$ might be connected to the second segment $104b_i$ to connect the other side of the source-drain path (e.g., drain) of the transistor finger $102_1$ to the high-voltage node 106 connected to the circuit to be discharged. In this embodiment, the second contact $204_1$ might be connected to the second segment $104b_i$ such that the entire second segment $104b_i$ is floating.

The high-voltage node 106 might include a resistance 404 (e.g., parasitic resistance) along its length such that without compensation by discharge circuit 400, different currents might be discharged through one or more of the unit cells $402_0$ to $402_i$ resulting in imbalance. Thus, to equalize the current discharged through each unit cell $402_0$ to $402_i$, the resistance of one or more unit cells affected by the resistance 404 might be reduced as indicated for example by unit cell $402_i$.

Each unit cell $402_i$ includes a transistor finger $102_i$ and a metal resistor portion $104a_i/104b_i$. The metal resistor portion includes a first segment $104a_i$ and a second segment $104b_i$. The first segment $104a_i$ might be directly connected to one side of the source-drain path (e.g., source) of the transistor finger $102_i$, and the second segment $104b_i$ might be directly connected to the other side of the source-drain path (e.g., drain) of the transistor finger $102_i$. The gate of the transistor finger $102_i$ might be connected to the control signal node 110.

Unit cell $402_i$ also includes a first contact $202_i$ and a second contact $204_i$. Similarly to unit cells $402_0$ and $402_1$, the second contact $204_i$ might be connected to the second segment $104b_i$ to connect one side of the source-drain path (e.g., drain) of the transistor finger $102_i$ to the high-voltage node 106 connected to the circuit to be discharged. In this embodiment, the second contact $204_i$ might be connected to the second segment $104b_i$ such that the entire second segment $104b_i$ is floating. The first contact $202_i$ might be connected to the first segment $104a_i$ to connect the other side of the source-drain path (e.g., source) of the transistor finger $102_i$ to the reference voltage node 108. In this example, however, to compensate for resistance 404, the first contact $202_i$ might be connected to the first segment $104a_i$ such that a first part of the first segment $104a_i$ as indicated at $206_i$ is connected between the first contact $202_i$ and one side of the source-drain path (e.g., source) of the transistor finger $102_i$ and a second part of the first segment $104a_i$ as indicated at $208_i$ is floating. The point along first segment $104a_i$ where the first contact $202_i$ is connected may be adjusted to adjust the resistance connected between the first contact $202_i$ and one side of the source-drain path (e.g., source) of the transistor finger $102_i$. In this way, the resistance connected between the first contact $202_i$ and one side of the source-drain path (e.g., source) of the transistor finger $102_i$ plus the resistance 404 might equal the resistance of the first segment $104a_0$ of the unit cell $402_0$ and the first segment $104a_1$ of the unit cell $402_1$ such that the discharge currents of the unit cells $402_0$ to $402_i$ are balanced.

Figure 5:
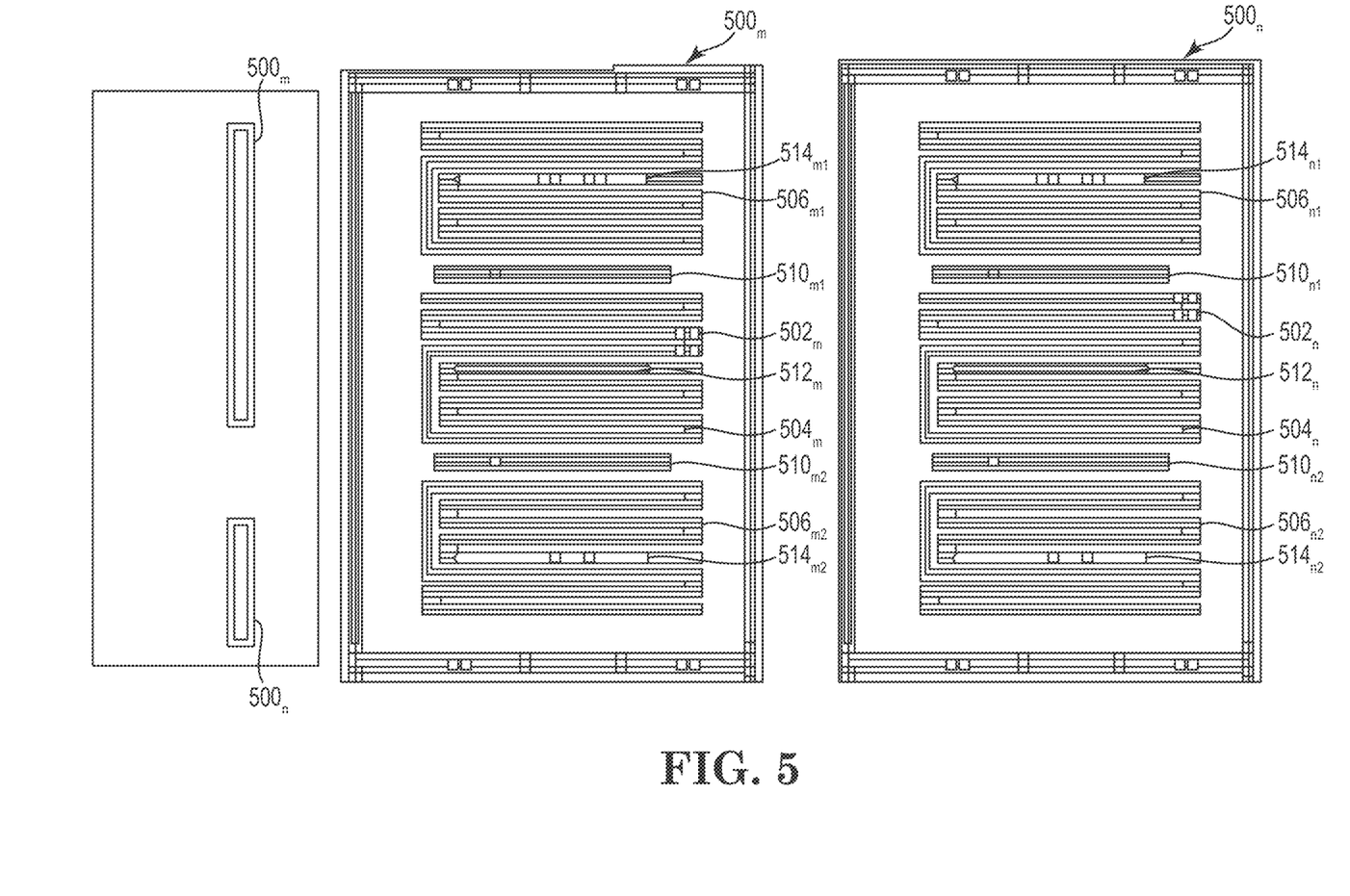
FIG. 5 is a schematic layout diagram of two banks of unit cells of a discharge circuit according to an embodiment.

FIG. 5 is a schematic layout diagram of two banks $500_m$ and $500_n$ of unit cells of a discharge circuit according to an embodiment. A plurality of banks may be connected in parallel to provide a discharge circuit, such as discharge circuit 100a, 100b, or 100c as previously described and illustrated with reference to FIGS. 1A-1C. As illustrated on the left of FIG. 5, a larger (e.g., more unit cells) bank $500_m$ includes a first source ballast resistance value and a smaller (e.g., fewer unit cells) bank $500_n$ includes a second source ballast resistance value different from the first source ballast resistance value. The different source ballast resistance values of banks $500_m$ and $500_n$ might be used to achieve current uniformity within a discharge circuit similarly as described above with reference to FIG. 4.

As illustrated in the center of FIG. 5, each unit cell of bank $500_m$ might include two transistor fingers including gate contacts $510_{m1}$ and $510_{m2}$, a source contact $512_m$, drain contacts $514_{m1}$ and $514_{m2}$, a reference voltage node contact $502_m$, and metal resistor portion segments $504_m$, $506_{m1}$, and $506_{m2}$. Gate contacts $510_{m1}$ and $510_{m2}$ might connect the corresponding gates of the transistor fingers to a control signal node 110 (FIG. 4). Source contact $512_m$, which might be shared by both transistor fingers, might connect the source of both transistor fingers to the segment $504_m$ of the metal resistor portion. Reference voltage node contact $502_m$ might be connected to segment $504_m$ to set the source ballast resistance value of each transistor finger of bank $500_m$. In this example, the reference voltage node contact $502_m$ is connected to segment $504_m$ such that a first part of segment $504_m$ is connected between the source contact $512_m$ and the reference voltage node contact $502_m$ and a second part of the segment $504_m$ is floating. Drain contact $514_{m1}$ might connect the drain of one transistor finger to the segment $506_{m1}$ of the metal resistor portion, and drain contact $514_{m2}$ might connect the drain of the other transistor finger to the segment $506_{m2}$ of the metal resistor portion. In this example, the drain contacts $514_{m1}$ and $514_{m2}$ might also be connected to a high-voltage node 106 (FIG. 4) such that each segment $506_{m1}$ and $506_{m2}$ is floating.

As illustrated on the right of FIG. 5, each unit cell of bank $500_n$ might include two transistor fingers including gate contacts $510_i$ and $510_{n2}$, a source contact $512_n$, drain contacts $514_{n1}$ and $514_{n2}$, a reference voltage node contact $502_n$, and metal resistor portion segments $504_n$, $506_{n1}$, and $506_{n2}$. Gate contacts $510_{n1}$ and $510_{n2}$ might connect the corresponding gates of the transistor fingers to a control signal node 110 (FIG. 4). Source contact $512_n$, which might be shared by both transistor fingers, might connect the source of both transistor fingers to the segment $504_n$ of the metal resistor portion. Reference voltage node contact $502_n$ might be connected to segment $504_n$ to set the source ballast resistance value of each transistor finger of bank $500_n$. In this example, the reference voltage node contact $502_n$ is connected to segment $504_n$ such that a first part of segment $504_n$ is connected between the source contact $512_n$ and the reference voltage node contact $502_n$ and a second part of the segment $504_n$ is floating. In bank $500_n$, however, the resistance of the first part between the source contact $512_n$ and the reference voltage node contact $502_n$ is greater than the resistance of the first part between the source contact $512_m$ and the reference voltage node contact $502_m$ of bank $500_m$. Drain contact $514_{n1}$ might connect the drain of one transistor finger to the segment $506_{n1}$ of the metal resistor portion, and drain contact $514_{n2}$ might connect the drain of the other transistor finger to the segment $506_{n2}$ of the metal resistor portion. In this example, the drain contacts $514_{n1}$ and $514_{n2}$ might also be connected to a high-voltage node 106 (FIG. 4) such that each segment $506_{n1}$ and $506_{n2}$ is floating.

Figure 6:
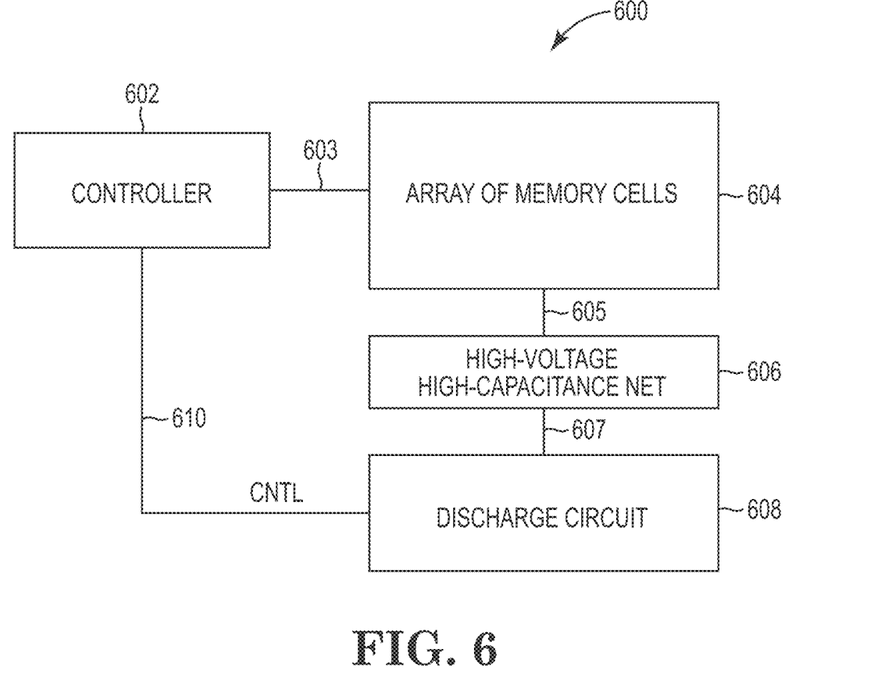
FIG. 6 is a simplified block diagram of a memory device including a discharge circuit according to an embodiment.

FIG. 6 is a simplified block diagram of a memory device 600 according to an embodiment. Memory device 600 includes a controller 602, an array of memory cells 604, a high-voltage (e.g., greater than 15V), high-capacitance (e.g., greater than 1 nF) net 606, and a discharge circuit 608. Controller 602 is in communication with array of memory cells 604 through a communication path 603. Controller 602 is connected to discharge circuit 608 through a control (CNTL) signal path 610. Array of memory cells 604 is connected to high-voltage, high-capacitance net 606 through a signal path 605. High-voltage, high-capacitance net 606 is connected to discharge circuit 608 through a signal path 607.

Controller 602 might include a microcontroller, a control unit (CU), a central processing unit (CPU), or other suitable logic circuitry. Controller 602 might be configured to perform access operations (e.g., read, program, and/or erase) on the array of memory cells 604 and to selectively enable the discharge circuit 608 to discharge the high-voltage, high-capacitance net 606. High-voltage, high-capacitance net 606 might be charged and discharged to perform the access operations on the array of memory cells 604. In some embodiments, the high-voltage, high capacitance net 606 might provide the high-voltage node 106 previously described and illustrated with reference to FIGS. 1A-5.

Discharge circuit 608 might be configured to discharge the high-voltage, high-capacitance net 606 in response to a control signal from the controller 602 on signal path 610. In some embodiments, the discharge circuit 608 might include the discharge circuit 100a, 100b, 100c, or 400 previously described and illustrated with reference to FIGS. 1A-1C and 4, respectively. The controller 602 might be configured to enable the discharge circuit 608 and prevent snapback and remain in a safe operating area (SOA) by applying a first voltage level to the gate of the transistor 102 (FIG. 1A-1C or 4) of the discharge circuit for a first period followed by a second voltage level higher than the first voltage level for a second period.

Figure 7:
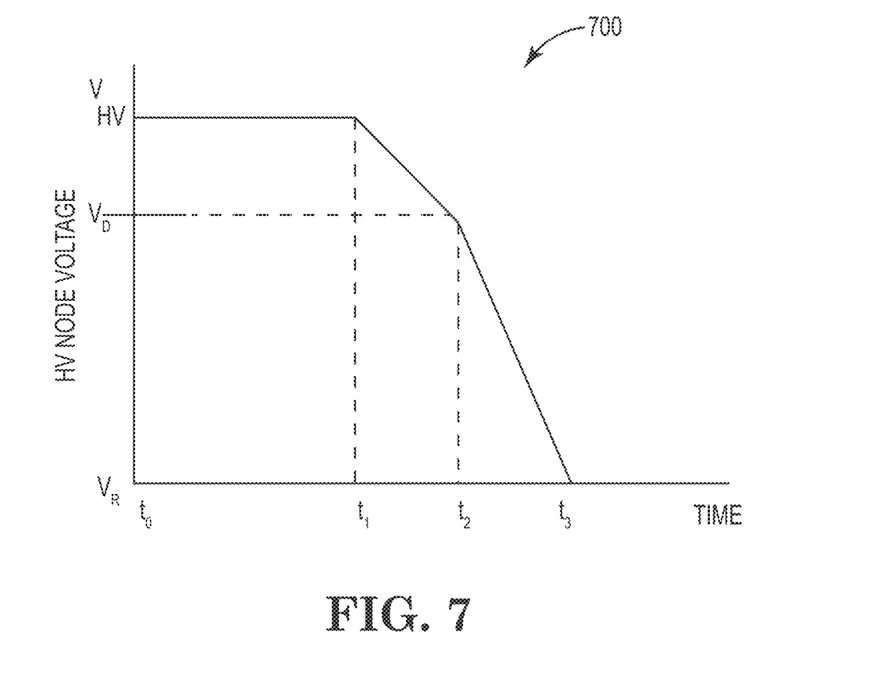
FIG. 7 is a chart illustrating the operation of a discharge circuit according to an embodiment.

FIG. 7 is a chart 700 illustrating the operation of a discharge circuit according to an embodiment. Chart 700 includes the voltage on the high-voltage, high-capacitance net 606 (e.g., high-voltage node 106) versus time. At time t0, the high-voltage node might be fully charged to a high-voltage ($V_{HV}$), such as a voltage within a range between 15V and 30V. At time $t_1$, the discharge circuit might be enabled by applying a first voltage level to the gate of the transistor 102 (FIG. 1A-1C or 4). In response to applying the first voltage to the gate of the transistor 102, the voltage on the high-voltage node begins to discharge at a first rate as indicated between times $t_1$ and $t_2$. Once the voltage of the high-voltage node is discharged to a voltage ($V_D$) where snapback is no longer a concern, a second voltage level higher than the first voltage level might be applied to the gate of the transistor 102. The voltage $V_D$ might be detected by controller 602 (FIG. 6) or based on a delay from time $t_1$. In response to applying the second voltage to the gate of the transistor 102 at time t2, the voltage on the high-voltage node discharges at a second rate faster than the first rate as indicated between times $t_2$ and $t_3$. At time $t_3$, the high-voltage node might be fully discharged to the reference voltage (VR) (e.g., a common or ground voltage). In other embodiments, more than two increasingly higher voltage levels may be applied to the gate of the transistor 102 for respective predetermined periods to discharge the high-voltage node while mitigating snapback and SOA concerns.

Figure 8:
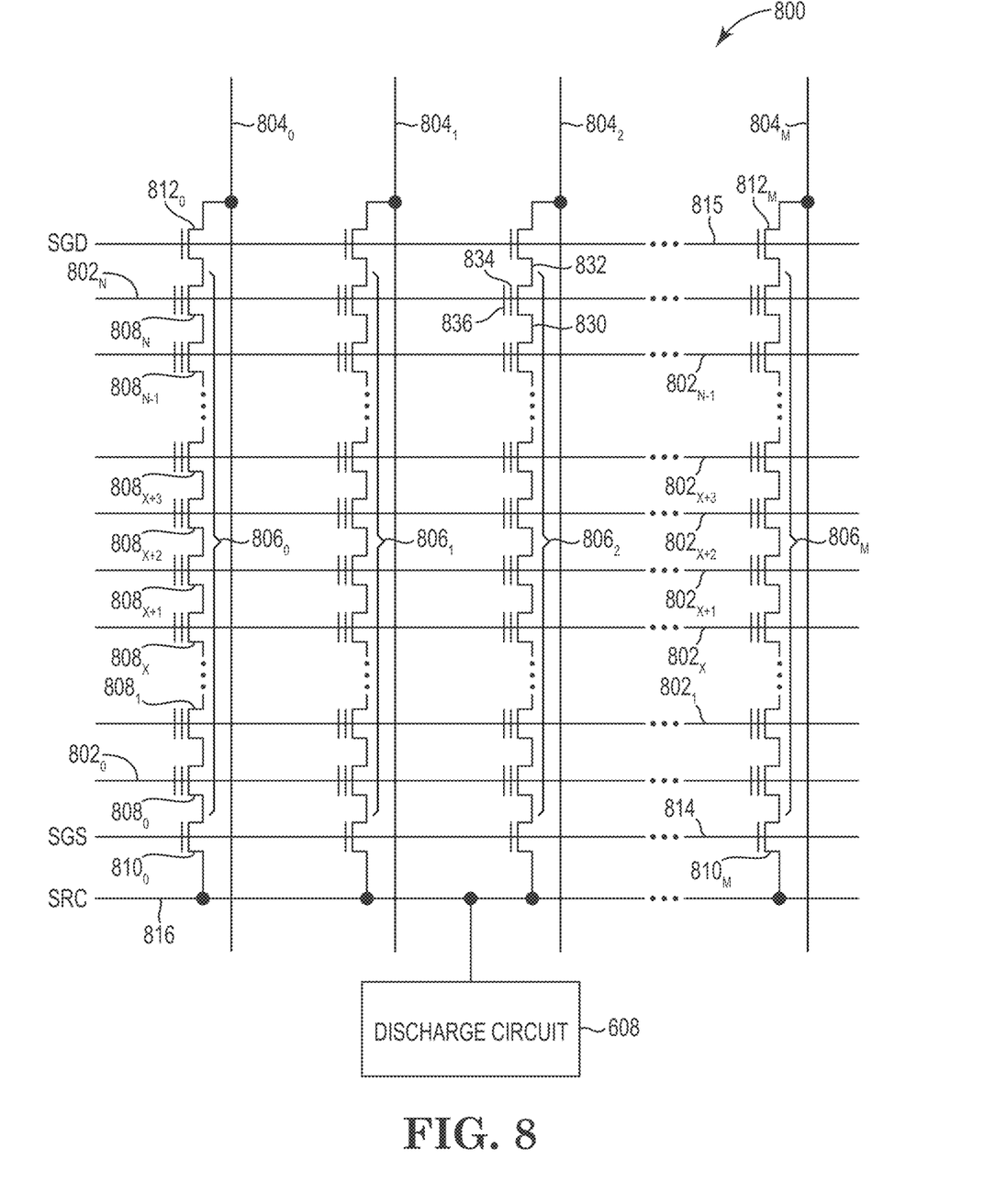
FIG. 8 is a schematic diagram of a portion of an array of memory cells according to an embodiment.

FIG. 8 is a schematic of a portion of an array of memory cells 800, such as a NAND memory array, as could be used in a memory of the type described with reference to FIG. 6, e.g., as a portion of array of memory cells 604. Memory array 800 includes access lines (e.g., word lines) 802$_0$ to 802$_N$, and data lines (e.g., bit lines) 804$_0$ to 804$_M$. The access lines 802 might be connected to global access lines (e.g., global word lines), not shown in FIG. 8, in a many-to-one relationship. For some embodiments, memory array 800 might be formed over a semiconductor that, for example, might be conductively doped to have a conductivity type, such as a p-type conductivity, e.g., to form a p-well, or an n-type conductivity, e.g., to form an n-well.

Memory array 800 might be arranged in rows (each corresponding to an access line 802) and columns (each corresponding to a data line 804). Each column might include a string of series-connected memory cells (e.g., non-volatile memory cells), such as one of NAND strings 806$_0$ to 806$_M$. Each NAND string 806 might be connected (e.g., selectively connected) to a common source (SRC) 816 and might include memory cells 808$_0$ to 808$_N$. The common source 816 might have a capacitance (e.g., parasitic capacitance) greater than 1 nF. The memory cells 808 might represent non-volatile memory cells for storage of data. The memory cells 808$_0$ to 808$_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 808 of each NAND string 806 might be connected in series between a select gate 810 (e.g., a field-effect transistor), such as one of the select gates 810$_0$ to 810$_M$ (e.g., that might be source select transistors, commonly referred to as select gate source), and a select gate 812 (e.g., a field-effect transistor), such as one of the select gates 812$_0$ to 812$_M$ (e.g., that might be drain select transistors, commonly referred to as select gate drain). Select gates 810$_0$ to 810$_M$ might be commonly connected to a select line 814, such as a source select line (SGS), and select gates 812$_0$ to 812$_M$ might be commonly connected to a select line 815, such as a drain select line (SGD). Although depicted as traditional field-effect transistors, the select gates 810 and 812 might utilize a structure similar to (e.g., the same as) the memory cells 808. The select gates 810 and 812 might represent a plurality of select gates connected in series, with each select gate in series configured to receive a same or independent control signal.

A source of each select gate 810 might be connected to common source 816. The drain of each select gate 810 might be connected to a memory cell 808$_0$ of the corresponding NAND string 806. For example, the drain of select gate 810$_0$ might be connected to memory cell 808$_0$ of the corresponding NAND string 806$_0$. Therefore, each select gate 810 might be configured to selectively connect a corresponding NAND string 806 to common source 816. A control gate of each select gate 810 might be connected to select line 814.

The drain of each select gate 812 might be connected to the data line 804 for the corresponding NAND string 806. For example, the drain of select gate 812$_0$ might be connected to the data line 804$_0$ for the corresponding NAND string 806$_0$. The source of each select gate 812 might be connected to a memory cell 808$_N$ of the corresponding NAND string 806. For example, the source of select gate 812$_0$ might be connected to memory cell 808$_N$ of the corresponding NAND string 806$_0$. Therefore, each select gate 812 might be configured to selectively connect a corresponding NAND string 806 to the corresponding data line 804. A control gate of each select gate 812 might be connected to select line 815.

The memory array in FIG. 8 might be a quasi-two-dimensional memory array and might have a generally planar structure, e.g., where the common source 816, NAND strings 806 and data lines 804 extend in substantially parallel planes. Alternatively, the memory array in FIG. 8 might be a three-dimensional memory array, e.g., where NAND strings 806 might extend substantially perpendicular to a plane containing the common source 816 and to a plane containing the data lines 804 that might be substantially parallel to the plane containing the common source 816.

Typical construction of memory cells 808 includes a data-storage structure 834 (e.g., a floating gate, charge trap, or other structure configured to store charge) that can determine a data state of the memory cell (e.g., through changes in threshold voltage), and a control gate 836, as shown in FIG. 8. The data-storage structure 834 might include both conductive and dielectric structures while the control gate 836 is generally formed of one or more conductive materials. In some cases, memory cells 808 might further have a defined source/drain (e.g., source) 830 and a defined source/drain (e.g., drain) 832. Memory cells 808 have their control gates 836 connected to (and in some cases form) an access line 802.

A column of the memory cells 808 might be a NAND string 806 or a plurality of NAND strings 806 selectively connected to a given data line 804. A row of the memory cells 808 might be memory cells 808 commonly connected to a given access line 802. A row of memory cells 808 can, but need not, include all memory cells 808 commonly connected to a given access line 802. Rows of memory cells 808 might often be divided into one or more groups of physical pages of memory cells 808, and physical pages of memory cells 808 often include every other memory cell 808 commonly connected to a given access line 802. For example, memory cells 808 commonly connected to access line $802_N$ and selectively connected to even data lines 804 (e.g., data lines $804_0$, $804_2$, $804_4$, etc.) might be one physical page of memory cells 808 (e.g., even memory cells) while memory cells 808 commonly connected to access line $802_N$ and selectively connected to odd data lines 804 (e.g., data lines $804_1$, $804_3$, $804_5$, etc.) might be another physical page of memory cells 808 (e.g., odd memory cells). Although data lines $804_3$-$804_5$ are not explicitly depicted in FIG. 8, it is apparent from the figure that the data lines 804 of the array of memory cells 800A might be numbered consecutively from data line $804_0$ to data line $804_M$. Other groupings of memory cells 808 commonly connected to a given access line 802 might also define a physical page of memory cells 808. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $802_0$-$802_N$ (e.g., all NAND strings 806 sharing common access lines 802). Unless expressly distinguished, a reference to a page of memory cells herein refers to the memory cells of a logical page of memory cells.

During an erase operation, the data lines 804 and the common source 816 might be biased to a first voltage level (e.g., an erase voltage, such as 20V), the access lines 802 might be biased to 0V, select line 815 might be biased to a second voltage level less than the first voltage level, and the select line 814 might be biased to a third voltage level less than the first voltage level. Discharge circuit 608 might be connected to common source 816 to selectively discharge common source 816 in response to a control signal from controller 602 (FIG. 6) as previously described, such as after completing an erase operation on the array of memory cells 800.

Although the example of FIG. 8 is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 9:
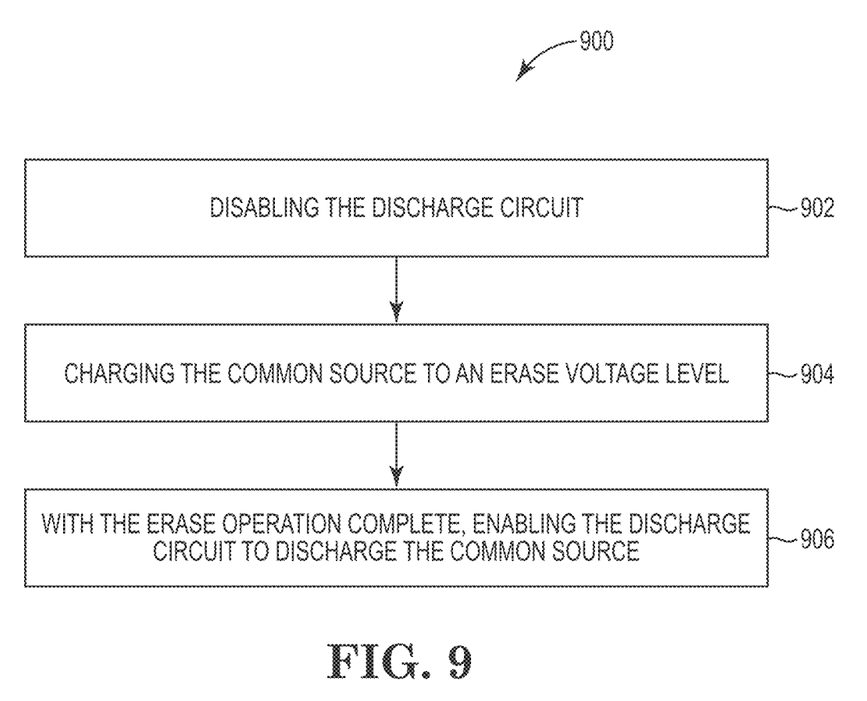
FIG. 9 is a flow diagram illustrating a method for performing an erase operation on an array of memory cells according to an embodiment.

FIG. 9 is a flow diagram illustrating a method 900 for performing an erase operation on an array of memory cells according to an embodiment. Method 900 might correspond at least in part to FIGS. 1A-8. The method might be in the form of computer-readable instructions, e.g., stored in controller 602 or array of memory cells 604 of FIG. 6. Such computer-readable instructions might be executed by a controller, e.g., the controller 602, to cause the memory device 600 to perform the method. Method 900 might be implemented by a memory device 600 including a common source 816, an array of memory cells 800 connected to the common source 816, and a discharge circuit 608 connected to the common source 816 as previously described and illustrated with reference to FIGS. 6 and 8. At 902, method 900 includes disabling the discharge circuit. At 904, method 900 includes charging the common source to an erase voltage level (e.g., greater than 15V). At 906, method 900 includes with the erase operation complete, enabling the discharge circuit to discharge the common source.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A discharge circuit comprising:
   a transistor comprising a plurality of unit cells; and
   a metal resistor connected to the transistor, the metal resistor comprising a plurality of resistor portions corresponding to the plurality of unit cells,
   wherein each unit cell of the plurality of unit cells has a footprint and a corresponding resistor portion of the plurality of resistor portions is arranged within the footprint.

2. The discharge circuit of claim 1, further comprising:
   a controller configured to enable the discharge circuit by applying a voltage level to a gate of the transistor.

3. The discharge circuit of claim 2, wherein the controller is configured to enable the discharge circuit and prevent snapback by applying a first voltage level to the gate for a first period followed by a second voltage level higher than the first voltage level for a second period.

4. The discharge circuit of claim 1, wherein each resistor portion of the plurality of resistor portions comprises a first segment directly connected to a source of the transistor and a second segment directly connected to a drain of the transistor.

5. The discharge circuit of claim 4, further comprising:
   a plurality of first contacts, each first contact of the plurality of first contacts connected to a corresponding first segment to connect the source of the transistor to a reference voltage node; and
   a plurality of second contacts, each second contact of the plurality of second contacts connected to a corresponding second segment to connect a circuit to be discharged to the drain of the transistor.

6. The discharge circuit of claim 5, wherein each first contact is connected to the corresponding first segment such that the corresponding first segment is floating.

7. The discharge circuit of claim 5, wherein each first contact is connected to the corresponding first segment such that a first part of the corresponding first segment is connected between the first contact and the source of the transistor and a second part of the corresponding first segment is floating.

8. The discharge circuit of claim 5, wherein each second contact is connected to the corresponding second segment such that the corresponding second segment is floating.

9. The discharge circuit of claim 5, wherein each second contact is connected to the corresponding second segment such that a first part of the corresponding second segment is connected between the second contact and the drain of the transistor and a second part of the corresponding second segment is floating.

10. The discharge circuit of claim 5, wherein at least two first contacts of the plurality of first contacts are directly connected to different parts of the corresponding first segments.

11. The discharge circuit of claim 5, wherein at least two second contacts of the plurality of second contacts are directly connected to different parts of the corresponding second segments.

12. The discharge circuit of claim 1, wherein the transistor comprises a NMOS transistor.

13. The discharge circuit of claim 1, wherein the transistor comprises a triple well NMOS transistor.

14. The discharge circuit of claim 1, wherein each unit cell of the transistor comprises a transistor finger.

15. The discharge circuit of claim 2, wherein the controller is configured to enable the discharge circuit and prevent snapback by applying a first voltage level to the gate for a first period to discharge at a first rate followed by a second voltage level higher than the first voltage level for a second period to discharge at a second rate faster than the first rate.

16. A discharge circuit comprising:
a transistor comprising at least a first unit cell and a second unit cell, the first unit cell comprising a first transistor finger and the second unit cell comprising a second transistor finger; and
a metal resistor connected to the transistor, the metal resistor comprising at least a first resistor portion corresponding to the first unit cell and a second resistor portion corresponding to the second unit cell,
wherein the first unit cell has a first footprint and the first resistor portion is arranged within the first footprint and the second unit cell has a second footprint and the second resistor portion is arranged within the second footprint.

17. The discharge circuit of claim 16, further comprising:
a controller configured to enable the discharge circuit by applying a voltage level to a gate of the transistor, the gate of the transistor comprising a gate of the first gate finger and a gate of the second gate finger.

18. The discharge co claim 17, wherein the controller is configured to enable the discharge circuit and prevent snapback by applying a first voltage level to the gate of the transistor for a first period to discharge at a first rate followed by a second voltage level higher than the first voltage level for a second period to discharge at a second rate faster than the first rate.

19. The discharge circuit of claim 16, wherein each of the first resistor portion and the second resistor portion comprises a first segment directly connected to a source of the transistor and a second segment directly connected to a drain of the transistor.

20. The discharge circuit of claim 19, further comprising:
at least two first contacts, each first contact connected to a corresponding first segment to connect the source of the transistor to a reference voltage node; and
at least two second contacts, each second contact connected to a corresponding second segment to connect a circuit to be discharged to the drain of the transistor.

21. A discharge circuit comprising:
a transistor comprising a first bank of first unit cells and a second bank of second unit cells; and
a metal resistor connected to the transistor, the metal resistor comprising a plurality of resistor portions corresponding to the first unit cells and the second unit cells,
wherein each unit cell of the first unit cells and the second unit cells has a footprint and a corresponding resistor portion of the plurality of resistor portions is arranged within the footprint.

22. The discharge circuit of claim 21, wherein the first bank of first unit cells comprises more unit cells than the second bank of second unit cells.

23. The discharge circuit of claim 21, wherein the first bank and the second bank are connected in parallel.

* * * * *